(12) United States Patent
Horie (10) Patent No.: US 11,889,657 B2
(45) Date of Patent: Jan. 30, 2024

(54) ELECTRONIC CONTROL DEVICE

(71) Applicant: Hitachi Astemo, Ltd., Hitachinaka (JP)

(72) Inventor: Masao Horie, Tokyo (JP)

(73) Assignee: HITACHI ASTEMO, LTD., Ibaraki (JP)

(*) Notice: Subject to any disclaimer, the term of this patent is extended or adjusted under 35 U.S.C. 154(b) by 371 days.

(21) Appl. No.: 17/421,291

(22) PCT Filed: Jan. 21, 2020

(86) PCT No.: PCT/JP2020/001808
§ 371 (c)(1),
(2) Date: Jul. 7, 2021

(87) PCT Pub. No.: WO2020/174934
PCT Pub. Date: Sep. 3, 2020

(65) Prior Publication Data
US 2022/0007539 A1    Jan. 6, 2022

(30) Foreign Application Priority Data
Feb. 27, 2019    (JP) .................................. 2019-034370

(51) Int. Cl.
*H05K 5/02* (2006.01)
*H05K 7/20* (2006.01)
*H02G 3/08* (2006.01)

(52) U.S. Cl.
CPC ....... *H05K 7/20154* (2013.01); *H05K 5/0247* (2013.01); *H05K 7/20409* (2013.01); *H02G 3/081* (2013.01)

(58) Field of Classification Search
None
See application file for complete search history.

(56) References Cited

U.S. PATENT DOCUMENTS

| | | | | | |
|---|---|---|---|---|---|
| 5,091,823 A | * | 2/1992 | Kanbara | ............ | H05K 7/14322 361/736 |
| 7,113,400 B2 | * | 9/2006 | Nagata | ............... | H05K 7/20854 123/41.31 |

(Continued)

FOREIGN PATENT DOCUMENTS

| JP | 62-135551 U | 8/1987 |
|---|---|---|
| JP | 2005-085908 A | 3/2005 |
| JP | 2015-096010 A | 5/2015 |

OTHER PUBLICATIONS

International Search Report, PCT/JP2020/001808, dated Jun. 2, 2020 (4 pgs).

*Primary Examiner* — Courtney L Smith
(74) *Attorney, Agent, or Firm* — Volpe Koenig (57) ABSTRACT

An electronic control device for suppressing mixing of foreign substances includes a control board including a heat generation component, a housing, a support member that is provided in the housing and supports the board, a heat radiation fin on a surface opposite to a surface of the support member on which the control board is supported, an air cooling fan that intersects an extension direction of the heat radiation fin, and blows wind to the heat radiation fin, a wall portion between the control board and the air cooling fan, and extending from the support member toward the control board, a wiring passage at a top end of the wall portion, a wiring that is laid in the wiring passage, and electrically connects the air cooling fan and the control board, and a cover that covers the housing, and includes a protrusion fitted in the wiring passage.

12 Claims, 4 Drawing Sheets

(56) References Cited

U.S. PATENT DOCUMENTS

| | | | |
|---|---|---|---|
| 7,349,210 B2* | 3/2008 | Sheng | H01L 23/4093 |
| | | | 165/905 |
| 7,375,287 B2* | 5/2008 | Rathmann | H02K 11/33 |
| | | | 361/720 |
| 10,256,170 B2* | 4/2019 | Sueyoshi | H01L 23/467 |
| 11,737,235 B2* | 8/2023 | Matsumoto | H05K 7/20172 |
| | | | 454/83 |

* cited by examiner

ELECTRONIC CONTROL DEVICE

TECHNICAL FIELD

The present disclosure relates to an electronic control device.

BACKGROUND ART

In an electronic control device such as a vehicle control device mounted on a vehicle, the amount of generated heat increases as performance of an integrated circuit in the electronic control device is improved. Thus, it is an issue to improve heat radiation properties corresponding to an increase in the amount of generated heat. To solve this problem, for example, there is an attempt to shift from natural air cooling to forced air cooling using a blower such as a fan.

PTL 1 discloses a technique in which a cooling fan is attached to a housing device incorporating a printed circuit board on which an integrated circuit is mounted.

CITATION LIST

Patent Literature

PTL 1: JP 2005-85908 A

SUMMARY OF INVENTION

Technical Problem

When the blower is provided for the electronic control device, it is necessary to electrically connect the board including the integrated circuit and the blower to each other via a wiring in order to control the blower. In this case, there is a concern that foreign substances such as dust are mixed into the board via a wiring path on which the wiring is laid due to the wind from the blower.

The technique described in PTL 1 does not consider the mixing of the foreign substances into the printed circuit board.

An object of the present disclosure is to provide an electronic control device capable of suppressing mixing of foreign substances into a board.

Solution to Problem

An electronic control device according to an embodiment of the present embodiment includes a board including a heat generation component, a housing that houses the board, a support member that supports the board, a fin that is provided on a surface opposite to a surface of the support member on which the board is supported, a blower that is provided in a direction intersecting an extension direction of the fin, and blows wind to the fin, a wall portion that is provided between the board and the blower, and extends from the support member toward the board, a groove that is provided at a top end of the wall portion, a wiring that is laid in the groove, and electrically connects the blower and the board, and a cover that covers the housing, and includes a protrusion fitted in the groove.

Advantageous Effects of Invention

According to the present disclosure, it is possible to suppress the mixing of foreign substances into the board.

DESCRIPTION OF EMBODIMENTS

Hereinafter, an embodiment of the present disclosure will be described with reference to the drawings. Hereinafter, three directions orthogonal to each other are an X direction, a Y direction, and a Z direction, and a vertical direction is a Z direction.

Figure 1:
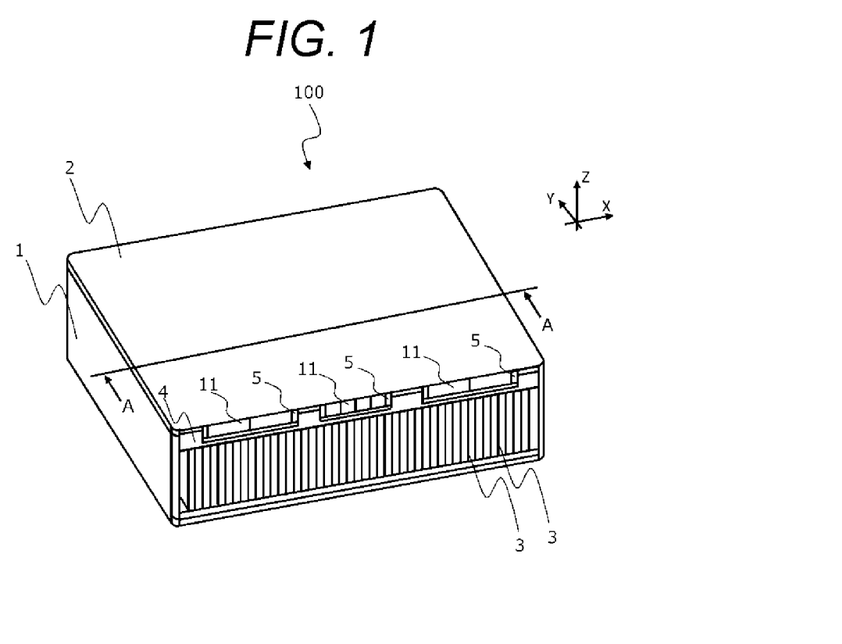
FIG. 1 is a perspective view schematically showing an appearance of an electronic control device according to an embodiment of the present disclosure.

FIG. 1 is a perspective view schematically showing an appearance of an electronic control device according to the embodiment of the present disclosure. A vehicle control device that is mounted on a vehicle (not shown) and controls units of the vehicle is assumed as the electronic control device shown in FIG. 1, but may be used for another purpose.

An electronic control device 100 shown in FIG. 1 has a housing 1 and a cover 2 that covers the housing 1. The housing 1 is made of a metal material having high thermal conductivity such as aluminum such as ADC12. The housing 1 may be made of a sheet metal such as iron or a non-metal material such as a resin material.

The cover 2 covers at least a part of an upper surface of the housing 1. The cover 2 is made of, for example, a sheet metal such as iron or a non-metal material such as a resin material.

The housing 1 has heat radiation fins 3 and a support member 4 for supporting the heat radiation fins 3. The support member 4 is provided substantially parallel to an XY plane. The heat radiation fin 3 is a fin for radiating heat in the housing 1, and extends downward in a substantially Z direction from a lower surface of the support member 4. There are a plurality of heat radiation fins 3, and these fins are arranged along a substantially X direction. The heat radiation fins 3 and the support member 4 are made of a metal material having high thermal conductivity such as aluminum such as ADC12. The heat radiation fins 3 and the support member 4 may be molded integrally with the housing 1 by a casting method such as die casting, or may be molded separately from the housing 1.

Exposed portions 5 that expose connectors 11 housed in the housing 1 are formed in the housing 1. Positions of the exposed portions 5 are not particularly limited, but in the example of the drawing, the exposed portions 5 are formed in a front surface of the housing 1. The exposed portions 5 are holes or notches. The connectors 11 are connected to an external device (not shown), and the electronic control device 100 can transmit and receive electric power and various signals to and from the external device via the connectors 11.

Figure 2:
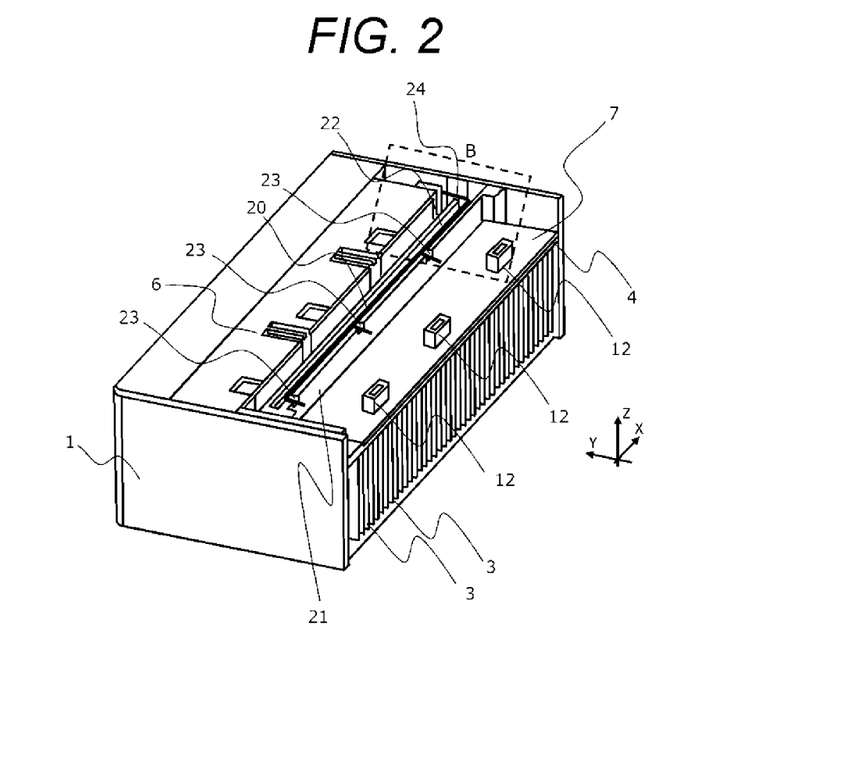
FIG. 2 is a partial perspective view showing a portion rearward from an AA line of FIG. 1.
Figure 3:
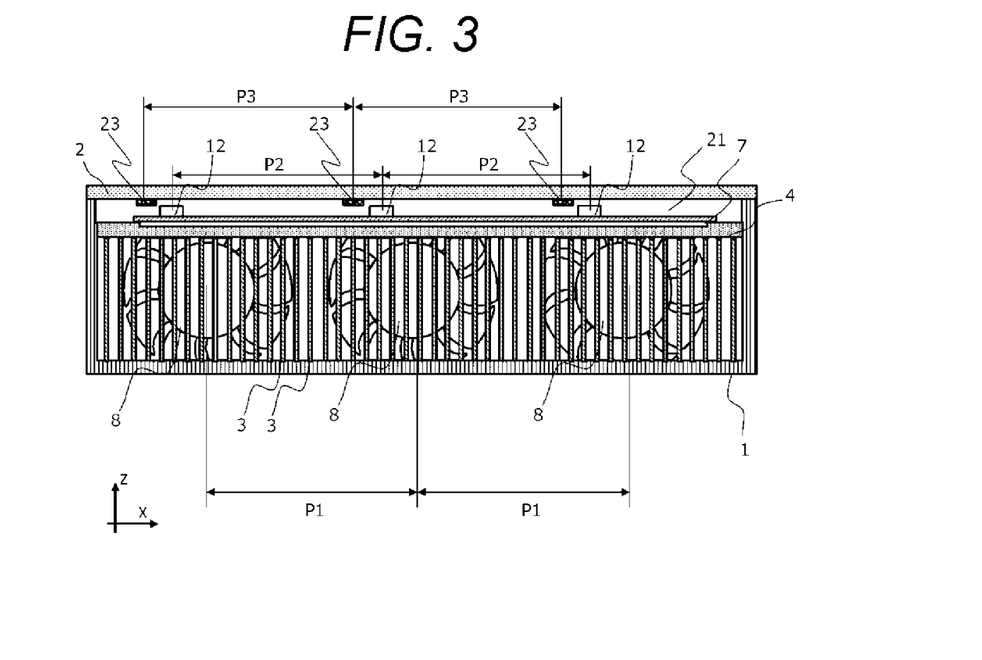
FIG. 3 is a cross-sectional view taken along the line AA of FIG. 1.

FIG. 2 is a partial perspective view showing a portion rearward from an AA line of FIG. 1, and FIG. 3 is a cross-sectional view of a cross section cut by the AA line of FIG. 1 as viewed from the front. FIG. 2 shows the electronic control device 100 in a state in which the cover 2 is removed.

As shown in FIGS. 2 and 3, the electronic control device 100 includes a fan holder 6 and a control board 7. The fan holder 6 and the control board 7 are housed in the housing 1.

The fan holder 6 supports air cooling fans 8. The air cooling fan 8 is a blower that generates wind for cooling the control board 7. The fan holder 6 and the air cooling fans 8 supported by the fan holder are provided on a lateral surface side of the heat radiation fins 3. In the example of the drawing, the fan holder 6 is provided at the rear of the housing 1, and the heat radiation fins 3 are provided on the front side of the housing 1 with respect to the fan holder 6. For example, an axial fan or a centrifugal fan can be used as the air cooling fans 8.

Instead of the air cooling fan 8, a blower that does not use a fan may be used.

One or a plurality of air cooling fans 8 may be supported by the fan holder 6. In the example of the drawing, the fan holder 6 supports three air cooling fans 8. The three air cooling fans 8 are arranged in the substantially X direction.

Figure 5:
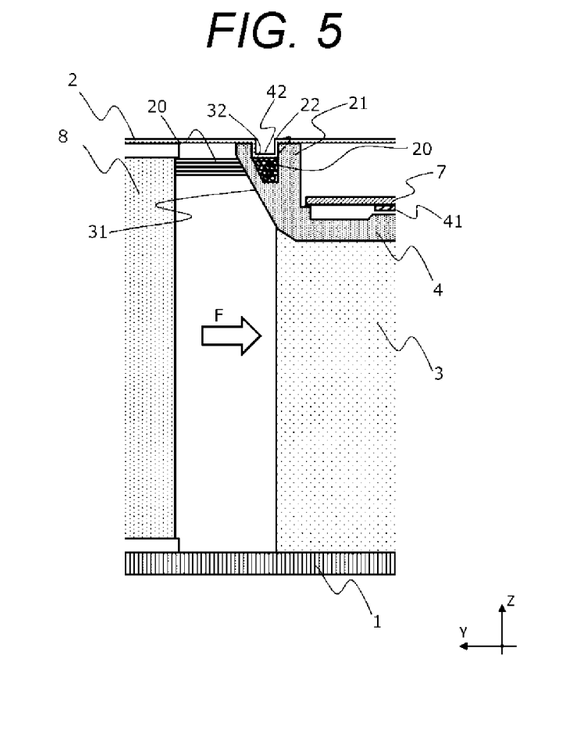
FIG. 5 is a cross-sectional view taken along a CC line of FIG. 4.

The control board 7 is a board including one or a plurality of heat generation components 41 (see FIG. 5). The heat generation component is a component that generates heat, and is, for example, a semiconductor element such as an integrated circuit. The control board 7 includes various electronic components (not shown) such as a passive element such as a capacitor, a connection wiring pattern (not shown) for connecting the electronic components to the connectors 11. The control board 7 is made of, for example, an organic material such as an epoxy resin. The control board 7 may be a single-layer board or a multilayer board.

The support member 4 that supports the heat radiation fins 3 also functions as a member that supports the control board 7. The control board 7 is provided on an upper surface of the support member 4 that supports the heat radiation fins 3 so as to be positioned above the heat radiation fins 3 with the support member 4 interposed therebetween. Connectors 12 which are connection portions for electrical connection with the air cooling fans 8 supported by the fan holder 6 via wirings 20 are provided on the control board 7. In the example of the drawing, the connectors 12 are provided on an upper surface of the control board 7.

A wall portion 21 that is provided between the control board 7 and the air cooling fans 8 (fan holder 6) and extends from the upper surface of the support member 4 toward the control board 7 is provided at the support member 4. A wiring passage 22 which is a groove for laying the wirings 20 is formed at a top end (upper portion) of the wall portion 21, and communication ports 23 and 24 to be communicatively connected with the wiring passage 22 are formed on a lateral surface of the wall portion 21. The communication ports 23 and 24 are notches in the present embodiment, but may be holes.

The communication ports 23 are first communication ports that communicatively connect a wall surface of the wall portion 21 close to the control board 7 with the wiring passage 22, and the communication ports 24 are second communication ports that communicatively connect a wall surface of the wall portion 21 close to the air cooling fans 8 and the wiring passage 22. In the present embodiment, the wirings 20 are connected to the air cooling fans 8 in advance, and are laid from the air cooling fans 8 to the connectors 12 via the communication ports 24, the wiring passage 22, and the communication ports 23. Thus, the communication ports 24 may be referred to as inlets 24, and the communication ports 23 may be referred to as outlets 23. Although a state in which the wirings 20 are laid is shown in the drawings, the wirings 20 from the outlets 23 to the connectors 12 are omitted for the sake of convenience. The wirings 20 may not be connected to the air cooling fans 8 in advance.

When the plurality of air cooling fans 8 are provided as in the present embodiment, the connector 12 and the outlet 23 may be provided for each air cooling fan 8. In this case, the wiring 20 connected to the corresponding air cooling fan 8 is laid in each outlet 23, and each connector 12 is connected to the wiring 20 of the corresponding air cooling fan 8. A plurality of wirings 20 may be provided for each air cooling fan 8. In the present embodiment, four wirings 20 are laid for each air cooling fan 8, and a total of 12 wirings are laid. The inlets 24 may be shared by the plurality of air cooling fans 8.

It is desirable that the connectors 12 and the outlets 23 be arranged in the substantially X direction like the air cooling fans 8. It is desirable that fan pitches P1 at which the air cooling fans 8 is provided, connector pitches P2 at which the connectors 12 are provided, and outlet pitches P3 at which the outlets 23 are provided be substantially equal to each other.

Figure 4:
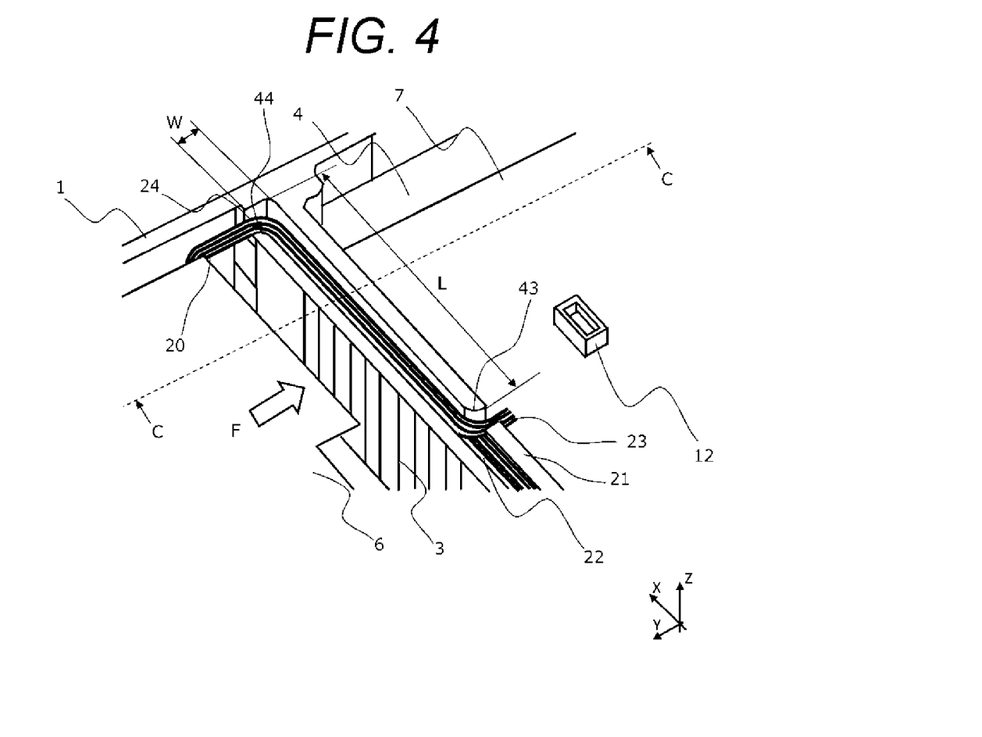
FIG. 4 is an enlarged perspective view of a region B of FIG. 2.
Figure 6:
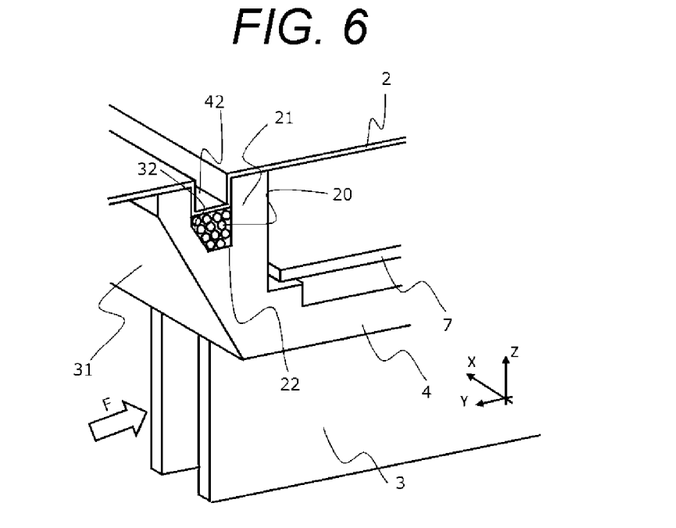
FIG. 6 is a cross-sectional perspective view taken along the CC line of FIG. 4.

FIG. 4 is an enlarged perspective view of a region B of FIG. 2, FIG. 5 is a longitudinal cross-sectional view taken along a CC line of FIG. 4, and FIG. 6 is a cross-sectional perspective taken along the CC line of FIG. 4.

As shown in FIGS. 4 to 6, the heat generation components 41 are formed on a lower surface of the control board 7. A heat conductive material (not shown) connected to the heat generation components 41 is formed on the lower surface of the control board 7, and the heat generation components 41 are connected to the support member 4 via the heat conductive material. The heat radiation fins 3 are provided below the control board 7. More specifically, the heat radiation fins 3 extend downward from a location positioned below the control board 7 on the lower surface of the support member 4.

The heat generated by the heat generation components 41 is transmitted to the support member 4 via the heat conductive material, and is radiated into the atmosphere by the heat radiation fins 3 formed on the lower surface of the support member 4. The air cooling fans 8 take in air from an air intake (not shown) provided on a back surface of the housing 1 by rotating, and blow the air to the heat radiation fins 3. The air from the air cooling fans 8 flows in an air blowing direction F indicated by arrows in FIGS. 5 and 6, passes between the heat radiation fins 3 adjacent to each other, and is exhausted from the front surface of the housing 1 together with the heat generated by the heat generation components 41. At this time, the cover 2 functions to suppress leakage of the wind from the air cooling fans 8 from the upper surface of the housing 1. The blowing direction F is substantially parallel to the Y direction in the present embodiment.

The heat generation components 41 may be provided on the upper surface of the control board 7. In this case, it is desirable that a heat conduction structure that transfers the heat generated by the heat generation components 41 to the lower surface of the control board 7 be provided on the control board 7. Examples of the heat conduction structure include wiring patterns, thermal vias, through-holes, and the like.

The wall portion 21 is provided on a side of the support member 4 closer to the air cooling fans 8 than the control board 7, and extends from the support member 4 toward the control board 7. In the example of the drawing, the wall portion is provided near an end edge of the support member 4 close to the air cooling fans 8. The wall portion 21 may be molded integrally with the support member 4, or may be molded separately from the support member 4. A wall surface 31 of the wall portion 21 may be substantially parallel to the Z direction or may be inclined with respect to the Z direction. As shown in FIG. 5, it is desirable that the wall surface 31 of the wall portion 21 close to the air cooling fans 8 be inclined in a direction closer to the control board 7 as the wall surface goes downward. In this case, the air from the air cooling fans 8 can be efficiently guided to the heat radiation fins 3.

The wiring passage 22 formed at the top end of the wall portion 21 is formed in a direction from the air cooling fans 8 toward the heat radiation fins 3, that is, in the substantially X direction substantially orthogonal to the air blowing direction F of the air cooling fans 8. At least one of inner wall surfaces 32 of the wiring passage 22 may be inclined in a direction in which a width W of the wiring passage becomes narrower as the inner wall surface becomes closer to a bottom surface of the wiring passage 22. In the example of the drawing, the inner wall surface 32 of the wiring passage 22 close to the air cooling fans 8 is inclined.

It is desirable that a length L from the inlet 24 of the wiring passage 22 to the outlet 23 closest to the inlet 24 be sufficiently longer than a maximum value of the width W of the wiring passage 22. For example, the length is five times or more longer than the maximum value of the width W of the wiring passage 22.

A protrusion 42 having a convex shape toward the wiring passage 22 is formed at a position of the cover 2 facing the wiring passage 22. The protrusion 42 is fitted in the wiring passage 22. At this time, the protrusion 42 may press the wirings 20 laid in the wiring passage 22. The wirings 20 may be covered with an elastic material such as resin, and the coating of the wiring 20 may be deformed by pressing by the protrusion 42. The protrusion 42 may be formed along the wiring passage 22.

A corner portion 43 of the outlet 23 in contact with the wiring passage 22 and a corner portion 44 of the inlet 24 in contact with the wiring passage 22 may be formed by a convex curved surface having a radius of curvature equal to or larger than a thickness of the wiring 20. Specifically, the thickness of the wiring 20 is a diameter of one wiring. The outlet 23 and the inlet 24 are formed along the substantially Y direction that is substantially orthogonal to the substantially X direction in which the wiring passage 22 extends.

Figure 7:
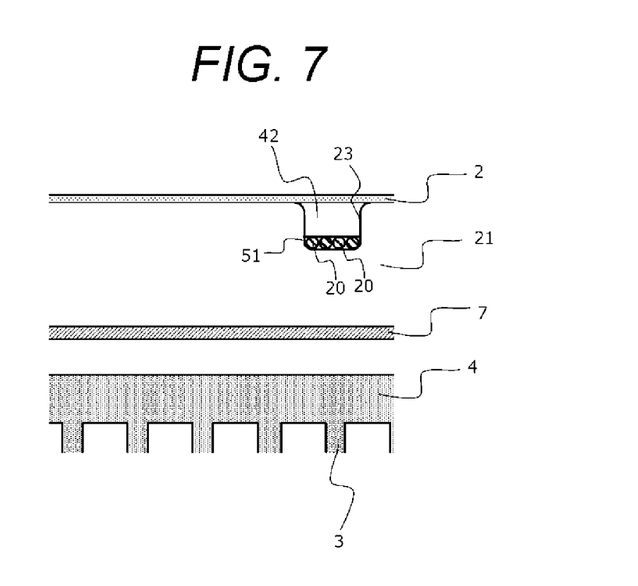
FIG. 7 is an enlarged view near outlets.

FIG. 7 is an enlarged view near the outlets 23. As shown in FIG. 7, the outlets 23 are notches provided in the wall portion 21. It is desirable that an area of an opening 51 constituted by the protrusion 42 and the outlet 23 of the wiring passage 22 in a state in which the cover 2 is provided be substantially equal to the sum of circumscribed cross-sectional areas of the four wirings 20 laid in the outlet 23.

Figure 8:
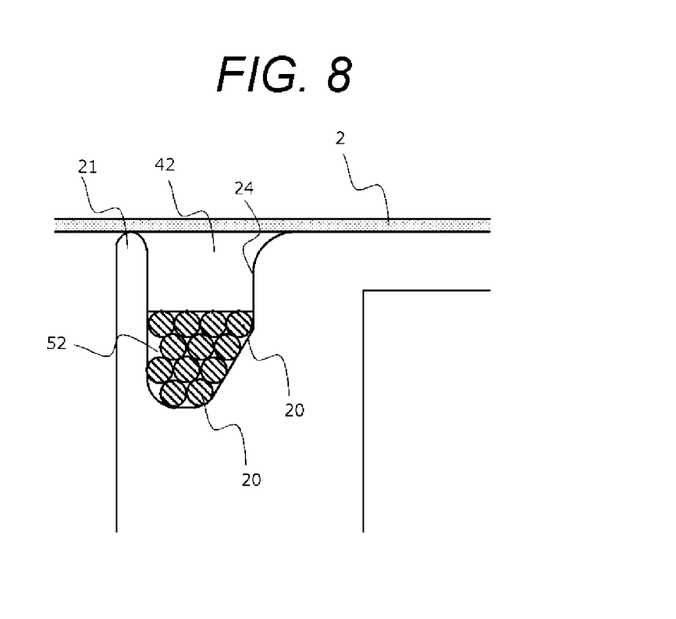
FIG. 8 is an enlarged view near inlets.

FIG. 8 is an enlarged view near the inlets 24. As shown in FIG. 8, the inlet 24 is a notch provided in the wall portion 21. An area of an opening 52 constituted by the protrusion 42 and the inlet 24 of the wiring passage 22 in a state in which the cover 2 is provided is substantially equal to the sum of circumscribed cross-sectional areas of the 12 wirings 20 laid in the inlet 24.

As described above, the present disclosure includes the following matters.

An electronic control device (100) according to an aspect of the present disclosure includes a board (7) including a heat generation component (41); a housing (1) that houses the board, a support member (4) that is provided in the housing (1) and supports the board, a fin (3) that is provided on a surface opposite to a surface of the support member on which the board is supported, a blower (8) that is provided on a lateral surface side of the fin, and blows wind to the fin, a wall portion (21) that is provided between the board and the blower, and extends from the support member toward the board, a groove (22) that is provided at a top end of the wall portion, a wiring (20) that is laid in the groove, and electrically connects the blower and the board, and a cover (2) that covers the housing (1), and includes a protrusion (42) fitted in the groove.

In this case, the protrusion of the cover is fitted in the groove in which the wiring that electrically connects the blower and the board is laid. Accordingly, since it is possible to reduce the gap formed in the groove by the wiring and the protrusion, it is possible to suppress the mixing of foreign substances such as dust into the board via the groove due to the wind from the blower. Since it is possible to suppress the mixing of the foreign substances without using auxiliary components such as a sealing member and an elastic member, it is possible to suppress an increase in cost and the number of components.

The protrusion is fitted in the groove in a state in which the wiring is pressed. Thus, since it is possible to reduce the gap formed between the wiring and the protrusion, it is possible to more reliably suppress the mixing of the foreign substances into the board.

The protrusion is formed along the groove. Thus, since the region in which the gap becomes small, it is possible to more reliably suppress the mixing of the foreign substances into the board.

The groove extends in a direction substantially orthogonal to a direction from the blower toward the fin. Thus, since it is possible to suppress the inflow of the wind from the blower into the groove, it is possible to more reliably suppress the mixing of the foreign substances into the board.

At least one of inner wall surfaces (32) of the groove is inclined in a direction in which a width (W) of the groove becomes narrower as the inner wall surface becomes closer to a bottom surface of the groove. Thus, it is possible to easily lay the wiring in the groove.

The wall portion has a first communication port (23) which communicatively connects a lateral surface closer to the board with the groove and in which the wiring is laid, and the first communication port extends in a direction substantially orthogonal to a direction in which the groove extends. Thus, since it is possible to increase a flow path resistance at a portion at which the first communication port and the groove are in contact with each other, it is possible to more reliably suppress the mixing of the foreign substances into the board.

A corner portion (43) of the first communication port in contact with the groove is formed by a convex curved surface having a radius of curvature equal to or larger than a diameter of the wiring. Thus, since it is possible to lay the wiring along the corner portion, it is possible to reduce a load related to the wiring.

The first communication port is formed by a notch, and an area of an opening of the first communication port close to the groove in a state in which the protrusion is fitted in the groove is substantially equal to a circumscribed cross-sectional area of the wiring laid in the first communication port. Thus, since it is possible to suppress the inflow of wind into the groove from the first communication port, it is possible to more reliably suppress the mixing of the foreign substances into the board.

A plurality of the blowers are provided, the first communication port is provided for each of the blowers, the board has a connection portion (12) that is electrically connected with the blower via the wiring for each of the blowers, and the blower, the first communication port, and the connection portion are arranged along substantially the same direction at a substantially same interval. Thus, it is possible to align the wirings connected to the blowers to have the same length. Accordingly, since it is possible to assemble the electronic control device including the plurality of blowers by using one type of blower to which the wiring is connected in advance, it is possible to reduce work defects during assembly and improve work efficiency.

The wall portion has a second communication port (24) which communicatively connects a lateral surface close to the blower and the groove and in which the wiring is laid, and the second communication port extends in a direction substantially orthogonal to a direction in which the groove extends. Thus, since it is possible to increase the flow path resistance at the portion at which the second communication port and the groove are in contact with each other, it is possible to more reliably suppress the mixing of the foreign substances into the board.

A corner portion (44) of the second communication port in contact with the groove is formed by a convex curved surface having a radius of curvature equal to or larger than a diameter of the wiring. Thus, since it is possible to lay the wiring along the corner portion, it is possible to reduce a load related to the wiring.

The second communication port is formed by a notch, and an area of an opening of the second communication port close to the groove in a state in which the protrusion is fitted in the groove is substantially equal to a circumscribed cross-sectional area of the wiring laid in the second communication port. Thus, since it is possible to suppress the inflow of wind into the groove from the second communication port, it is possible to more reliably suppress the mixing of the foreign substances into the board.

The above-described embodiment of the present disclosure is an example for describing the present disclosure, and is not intended to limit the scope of the present disclosure only to the embodiment. Those skilled in the art can implement the present disclosure in various other aspects without departing from the scope of the present disclosure.

REFERENCE SIGNS LIST 1 housing
2 cover
3 heat radiation fin
4 support member
5 exposed portion
6 fan holder
7 control board
8 air cooling fan
11 to 12 connector
20 wiling
21 wall portion
22 wiling passage
23 communication port (outlet)
24 communication port (inlet)
31 wall surface
32 inner wall surface
41 heat generation component
42 protrusion
43 to 44 corner portion
51 to 52 opening
100 electronic control device

The invention claimed is:

1. An electronic control device, comprising:
    a board including a heat generation component;
    a housing that houses the board;
    a support member that supports the board;
    a fin that is provided on a surface opposite to a surface of the support member on which the board is supported;
    a blower that is provided on a lateral surface side of the fin, and blows wind to the fin;
    a wall portion that is provided between the board and the blower, and extends from the support member toward the board;
    a groove that is provided at a top end of the wall portion;
    a wiring that is laid in the groove, and electrically connects the blower and the board; and
    a cover that covers the housing, and includes a protrusion fitted in the groove.

2. The electronic control device according to claim 1, wherein the protrusion is fitted in the groove in a state in which the wiring is pressed.

3. The electronic control device according to claim 1, wherein the protrusion is formed along the groove.

4. The electronic control device according to claim 1, wherein the groove extends in a direction substantially orthogonal to a direction from the blower toward the fin.

5. The electronic control device according to claim 1, wherein at least one of inner wall surfaces of the groove is inclined in a direction in which a width of the groove becomes narrower as the inner wall surface becomes closer to a bottom surface of the groove.

6. The electronic control device according to claim 1, wherein
    the wall portion has a first communication port which communicatively connects a lateral surface closer to the board with the groove and in which the wiring is laid, and
    the first communication port extends in a direction substantially orthogonal to a direction in which the groove extends.

7. The electronic control device according to claim 6, wherein a corner portion of the first communication port in contact with the groove is formed by a convex curved surface having a radius of curvature equal to or larger than a diameter of the wiring.

8. The electronic control device according to claim 6, wherein
    the first communication port is formed by a notch, and
    an area of an opening of the first communication port close to the groove in a state in which the protrusion is fitted in the groove is substantially equal to a circumscribed cross-sectional area of the wiring laid in the first communication port.

9. The electronic control device according to claim 6, wherein
    a plurality of the blowers are provided,
    the first communication port is provided for each of the blowers,
    the board has a connection portion that is electrically connected with the blower via the wiring for each of the blowers, and
    the blower, the first communication port, and the connection portion are arranged along substantially the same direction at a substantially same interval.

10. The electronic control device according to claim 1, wherein
- the wall portion has a second communication port which communicatively connects a lateral surface close to the blower and the groove and in which the wiring is laid, and
- the second communication port extends in a direction substantially orthogonal to a direction in which the groove extends.

11. The electronic control device according to claim 10, wherein a corner portion of the second communication port in contact with the groove is formed by a convex curved surface having a radius of curvature equal to or larger than a diameter of the wiring.

12. The electronic control device according to claim 10, wherein
- the second communication port is formed by a notch, and
- an area of an opening of the second communication port close to the groove in a state in which the protrusion is fitted in the groove is substantially equal to a circumscribed cross-sectional area of the wiring laid in the second communication port.

\* \* \* \* \*